(12) United States Patent
Song et al.

(10) Patent No.: US 6,603,152 B2
(45) Date of Patent: Aug. 5, 2003

(54) BLUE LIGHT EMITTING DIODE WITH ELECTRODE STRUCTURE FOR DISTRIBUTING A CURRENT DENSITY

(75) Inventors: Kyung-Sub Song, Seoul (KR); Young-Ho Park, Kyungki-do (KR); Don-Bok Choi, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 09/899,993

(22) Filed: Jul. 9, 2001

(65) Prior Publication Data
US 2002/0047128 A1 Apr. 25, 2002

(30) Foreign Application Priority Data

Sep. 4, 2000 (KR) ........................................ 2000-51953
Jun. 18, 2001 (KR) ........................................ 2001-34460

(51) Int. Cl.$^7$ .............................................. H01L 33/00
(52) U.S. Cl. .............................. 257/99; 257/79; 257/82; 257/91
(58) Field of Search .............................. 257/79–82, 91, 257/99; 372/43–50

(56) References Cited

U.S. PATENT DOCUMENTS 5,696,389 A * 12/1997 Ishikawa et al. .............. 257/99
6,097,040 A    8/2000 Morimoto et al.
6,107,644 A * 8/2000 Shakuda et al. .............. 257/79
6,344,665 B1 * 2/2002 Sung et al. .................... 257/91

* cited by examiner

Primary Examiner—Nathan J. Flynn
Assistant Examiner—Johannes Mondt
(74) Attorney, Agent, or Firm—Lowe Hauptman Gilman & Berner, LLP (57) ABSTRACT

Disclosed is a blue light emitting diode comprising a laminate structure formed in the center of a first conductive nitride semiconductor layer, a first electrode formed on a part of a transparent metal layer included in the laminate structure and a second electrode formed on a peripheral part of the first conductive nitride semiconductor layer, which is not covered by the laminate structure. By altering the locations of the first electrode and the second electrode and forming electrode extensions thereof, it is possible to disperse effectively the current density. Accordingly, the concentration of the current density contributing to the rapid increase of the temperature can be avoided without a significant change of the laminate structure of the conventional light emitting diode. In addition it is possible to improve resistance to electrostatic discharge and to reduce the driving voltage.

12 Claims, 10 Drawing Sheets

PRIOR ART

FIG. 1a

PRIOR ART

FIG. 1B

PRIOR ART

FIG. 2a

PRIOR ART

BLUE LIGHT EMITTING DIODE WITH ELECTRODE STRUCTURE FOR DISTRIBUTING A CURRENT DENSITY

BACKGROUND OF THE INVENTION

1. Field of the Invention

The invention relates to a blue light emitting diode, and more particularly a blue light emitting diode, which has such an electrode structure as to prevent the concentration of current density, causative of a rapid temperature increase in the diode, thereby increasing resistance to electrostatic discharge (ESD) and lowering a deriving voltage without significantly altering the laminate structure of the electrode.

2. Description of the Related Art

Recently, a light emitting diode which is able to emit light in the region of short wavelength (ultraviolet light to green), particularly blue light has gained public popularity. Such semiconductor materials include ZnSe (II–VI), nitrides such as GaN, InN, AlN (III–V) and nitride mixtures combining these nitrides in a certain ratio and particularly GaN are widely used.

Growing of GaN crystal is effected by MOCVD (Metal Organic Chemical Vapor Deposition) method. The MOCVD method is carried out by supplying reactive gas of an organic compound into a reaction chamber at a temperature of 700 to 1200° C. to grow crystals in an epitaxial layer on a substrate, in which sapphire or SiC is used as the substrate. The reason that sapphire or SiC substrate is used is that there exist no substrates commercially available that can achieve lattice matching with the nitride crystal while having the same crystalline structure as the nitride crystal. Also, it can hardly be expected that the growth process of an epitaxial layer on such substrate would form a good quality of crystal, due to the stress resulting from lattice mis-matching. Therefore, a buffer layer is used as a low temperature-growing layer between the substrate and epitaxial layer.

Also, the blue light emitting diode with such a limited structure differs from the general light emitting diode in terms of the driving method, as explained below with reference to FIGS. 1a and 1b.

Figure 1A:
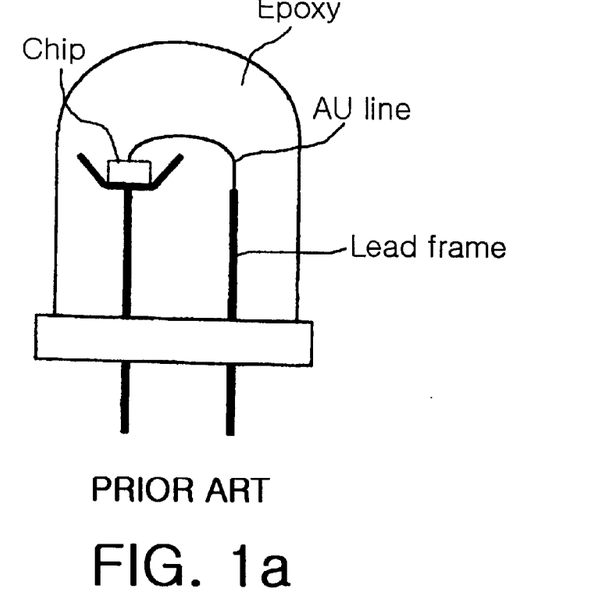
FIGS. 1a and 1b are schematic views showing the structural difference according to a driving method of a general light emitting diode and a blue light emitting diode.
Figure 1B:
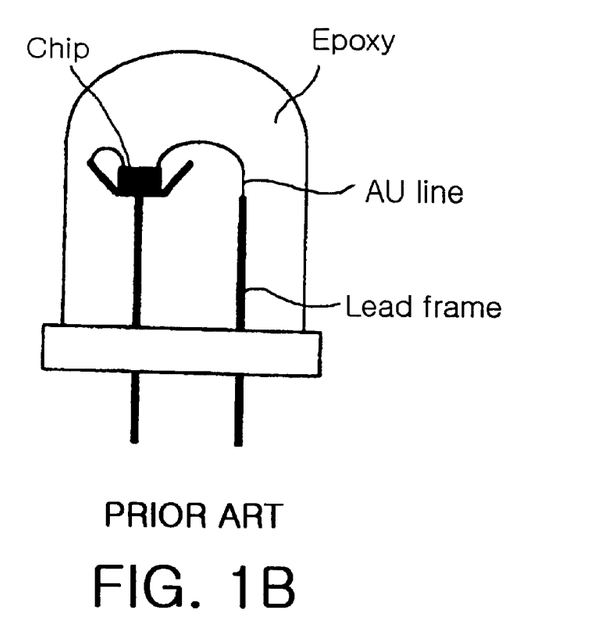

FIG. 1 schematically shows the difference in the driving manner between a general light emitting diode (for example, a class of LEDs using GaAs, GaP, etc) and a blue light emitting diode (III-nitride). In the general light emitting diode, as shown in FIG. 1a, a light emitting diode chip is operated using a total structure including a wafer which acts as a substrate for crystal growth. However, as shown in FIG. 1b, the blue light emitting diode is operated through a thin structure fabricated on a chip, but not through the substrate. That is, the blue light emitting diode has a planar type structure using the insulating substrate as a sapphire, unlike the general light emitting diode.

Figure 2A:
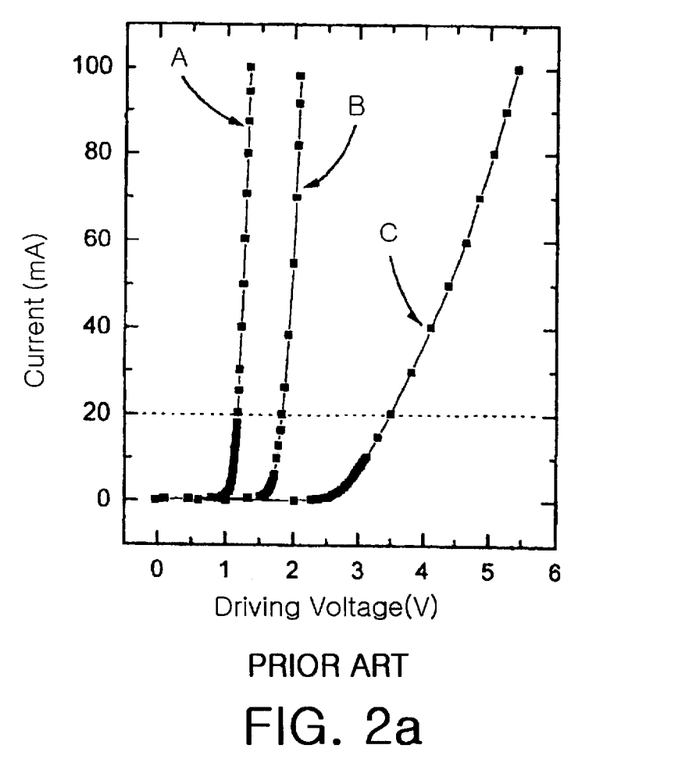
FIGS. 2a and 2b are graphs showing current-voltage characteristics and applied current-temperature change characteristics of an infrared light emitting diode, a red light emitting diode and a blue light emitting diode.
Figure 2B:
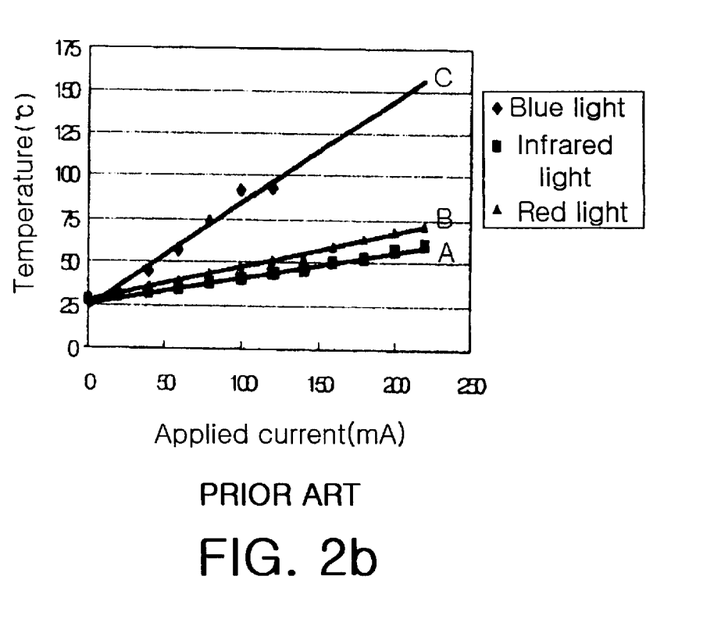

Further, the blue light emitting diode is known to need a relatively high driving voltage at a constant current, compared to the general light emitting diode. FIGS. 2a and 2b show the voltage-current characteristics of an infrared light emitting diode (A), a red light (wavelength 635 nm) emitting diode (B) and a blue light (wavelength 450 nm) emitting diode (C) in a driving region of a forward direction. The blue light emitting diode requires a driving voltage of about two times as high as the red light emitting diode at a rated current of 20 mA. It is thought that such a high driving voltage is attributed to properties of GaN semiconductor layer and the planar type structure.

As described above, the blue light emitting diode suffers from problems in two aspects. First, the blue light emitting diode must adopt a deriving method for use in a planar type structure owing to the structural limit of growing a semiconductor layer on a sapphire substrate and a buffer layer so as to grow crystals with prevention of lattice mismatching. Another problem with the blue light emitting diode is the inherent feature of requiring a higher driving voltage as compared to general light emitting diodes. Consequently, the driving method and the high driving voltage of the blue light emitting diode may lead to reduced reliability and deteriorated quality of products.

Figure 3A:
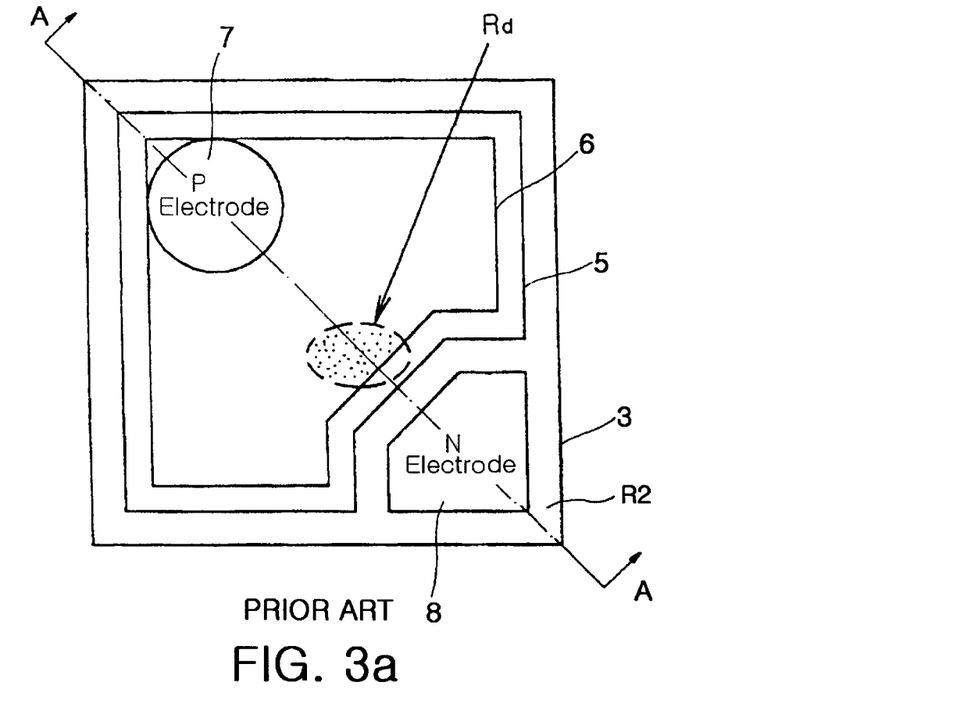
FIGS. 3a and 3b are a plan view of a conventional blue light emitting diode and a sectional view taken along line A—A of FIG. 3a, respectively.
Figure 3B:
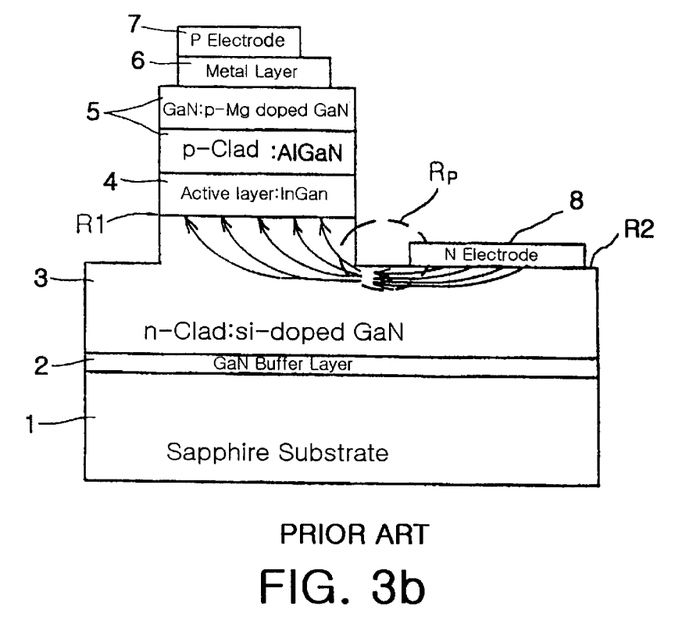

FIG. 3a is a plan view of the conventional blue light emitting diode and FIG. 3b is a sectional view of the diode, taken along line A—A in FIG. 3a. Referring to FIGS. 3a and 3b, problems caused by the above-described restrictive problems of the blue light emitting diode will be explained in detail. As shown in FIG. 3a, the conventional blue light emitting diode include a sapphire substrate 1, a buffer layer 2 formed on the substrate 1, an n-type nitride semiconductor layer 3 comprising a central part R1 in a predetermined region and a peripheral part R2 surrounding the central part R1, and a laminated structure formed on the n-type nitride semiconductor layer 3.

The laminated structure has an active layer 4 made of intrinsic nitride semiconductor crystal in the central part R1 on the N-type nitride semiconductor 3, a p-type nitride semiconductor layer 5 formed on the active layer 4, a metal layer 6 atop the semiconductor crystal layer 5, and a first electrode 7, corresponding to a P electrode, formed in a predetermined region on the metal layer 6. Also, the light emitting diode includes a second electrode 8 as a N electrode formed in the peripheral part R2 over the N-type nitride semiconductor layer 3 while keeping a predetermined distance space from the central part R12 over the N-type nitride semiconductor layer 3.

In such conventional blue light emitting diode, current flows as injected carriers move on the surface of the diode and at the interface between the electrodes in the characteristic driving manner of the planar type structure. Also, the blue light emitting diode requires a high driving voltage across a given area for light emission, thereby forming a flow of a great quantity of injected carrier (herein electron). The current path Rp formed by the above flow of the carriers is distributed in accordance with the area of the electrode formed at an upper position. In FIG. 3a, therefore, the current density distribution is very high in the region Rd defined with a dotted line, and decreases gradually toward the periphery. The higher current density at the region Rd defined with the dotted line leads the temperature of the entire chip to increase, resulting in reducing the light output.

In consequence, since the conventional blue light emitting diode of the planar type structure requires a high driving voltage, defects existing in the region where a high current density is generated causes the chip temperature to be increased as well as incurring quality deterioration, for example, weak resistance to electrostatic discharge (ESD), which cause fundamental problems in achieving the reliability and quality stabilization of products.

SUMMARY OF THE INVENTION

Therefore, it is an object of the present invention to overcome the above problems encountered in prior arts and to provide a blue light emitting diode with an improved electrode structure which is capable of effectively dispersing the current density concentration causative of local temperature increase in the blue light emitting diode without requiring a significant structural change.

Another object of the present invention is to provide a blue light emitting diode which is highly resistant to ESD with a resulting improvement in terms of the quality and reliability of products.

Still another object of the present invention is to provide a blue light emitting diode in which the driving voltage is reduced and the rapid increasing of a temperature occurring locally in the chip is suppressed.

In order to achieve the above object, the present invention provides a blue light emitting diode comprising an insulating substrate, typically in a square shape, and a first conductive nitride semiconductor layer formed on the insulating substrate to have a surface divided into a central part and a peripheral part. The peripheral part is provided over the surface adjacent to and along the edges of the nitride semiconductor layer and the central part surrounded by the peripheral part.

Also, the blue light emitting diode includes a laminate structure formed over the central part of the nitride semiconductor layer, in which the laminate structure comprises a nitride active layer on the nitride semiconductor layer, a second conductive nitride semiconductor layer formed on the active layer, a transparent metal layer formed on the second conductive nitride semiconductor layer and a first electrode formed over a part of the transparent metal layer.

Further, the blue light emitting diode includes a second electrode formed over the peripheral part of the first conductive nitride semiconductor layer which is not covered by the laminate structure. As the insulating substrate, sapphire substrate can be used. It is also possible to use a sapphire substrate further comprising a GaN buffer layer formed thereon.

Here, the first electrode is referred to as a P electrode and the second electrode is referred to as an N electrode. The peripheral part on the first conductive nitride semiconductor layer (the layer expressed by Si-doped GaN) means the edge exposed with no active layer formed, that is, a surface part of the Si-doped GaN layer surrounding the active layer. In a predetermined region of this part, a second electrode is formed. Defined as a region in which the active layer is formed, the central part on the first conductive nitride semiconductor layer is a convex plane part surrounded by the peripheral part.

The blue light emitting diode may comprise the buffer layer made of GaN, the first conductive nitride semiconductor layer made of Si-doped GaN, the active layer made of In1-xGaxN (0<x≦1) and the p-type nitride semiconductor layer made of Al1-xGaxN (0<x≦1) and Mg-doped GaN. The above composition describes a blue light emitting diode that is currently, most commonly embodied. This is applicable to the blue light emitting diode according to another embodiment of the present invention.

In such a light emitting diode, the locations of the first electrode and the second electrode are changed and extensions of these electrodes are formed, whereby the current density can be effectively dispersed. As a result, the concentration of current density, causative of a rapid temperature increase, can be avoided only by the change of the location of the electrode and the formation of extensions thereof without significant alteration of the structure of the diode. In addition, it is possible to increase the resistance to ESD and reduce the driving voltage.

The reason why the present invention is interested in the improvement of the electrode structure is that the problems with conventional blue light emitting diode, including temperature increase attributable to the current density concentration, weak resistance to ESD, and high driving voltage, can be eliminated only by a metal patterning process with requiring no significant changes in other fabricating processes for the blue light emitting diode, nor employment of new equipments and materials.

The most important thing to be considered in the electrode structure is which type of electrode structure, that is, which type of locations and extensions of electrodes can disperse more effectively the current density. Leading to the present invention, the extensive and thorough research and experiments were conducted by the present inventors, in which the first electrode and the second electrode were set at various locations while the distance from the central part to the peripheral part was varied. As a result, there were found preferred embodiments which have an excellent capability of dispersing the current density and high resistance to ESD, and are operable at reduced driving voltage, thereby enhancing the quality and reliability.

BRIEF DESCRIPTION OF THE DRAWINGS

The above objects, and other features and advantages of the present invention will become more apparent after a reading of the following detailed description when taken in conjunction with the drawings, in which:

FIG. 4a is a plan view of a blue light emitting diode according to the first embodiment of the present invention and FIG. 4b is a sectional view taken along line 2A—2A of FIG. 4a.

DESCRIPTION OF THE PREFERRED EMBODIMENTS

The application of the preferred embodiments of the present invention is best understood with reference to the accompanying drawings, wherein like reference numerals are used for like and corresponding parts, respectively.

Figure 4A:
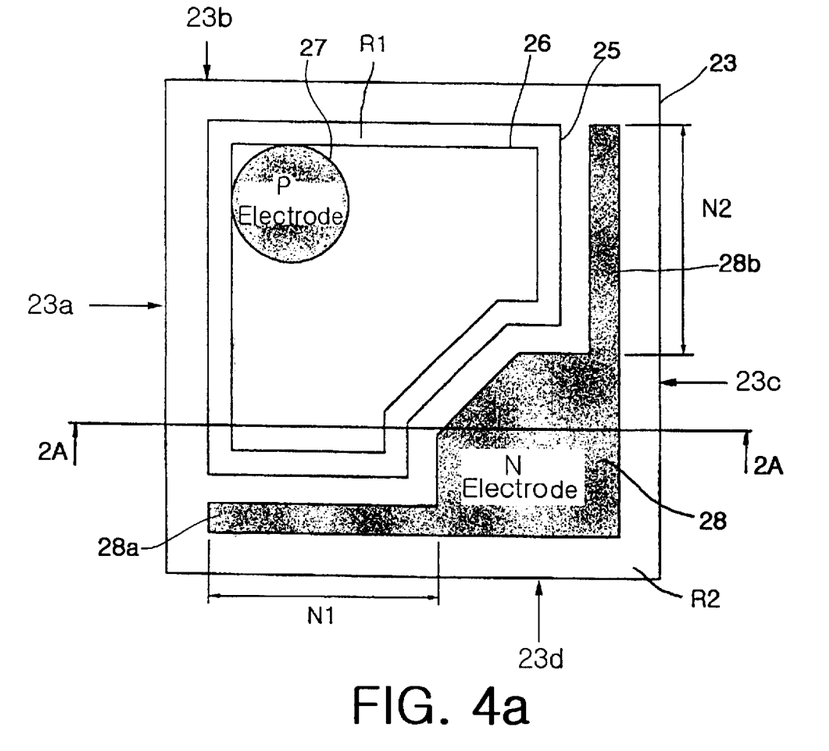
Figure 4B:
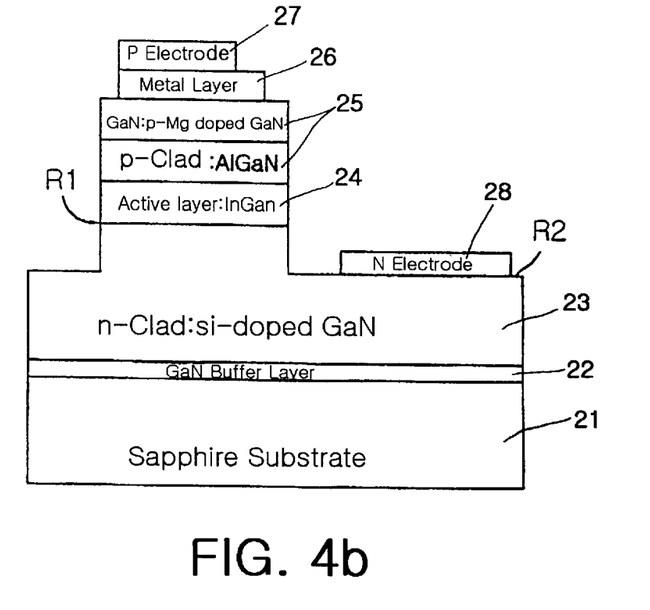

With reference to FIG. 4, there is shown a first preferred embodiment according to the present invention.

FIG. 4a shows a plan view of a blue light emitting diode according to the first embodiment of the present invention and FIG. 4b shows a sectional view taken along line 2A—2A in FIG. 4a. As shown in FIG. 4a, the blue light emitting diode of the first preferred embodiment according to the present invention includes an insulating substrate 21 typically in a square shape and a first conductive nitride semiconductor layer 23 formed on an entire surface of the insulating substrate 21. The nitride semiconductor layer 23 has a surface divided into a central part R1 and an exposed peripheral part R2. The peripheral part R2 is formed over the surfaces adjacent to edges 23a to 23d of the nitride semiconductor layer 23 and along the edges 23a to 23d, and the central part R1 is surrounded by the peripheral part R2. The blue light emitting diode further comprises a buffer layer 22 disposed between the insulating substrate 21 and the first conductive nitride semiconductor layer 23.

Also, the blue light emitting diode includes a laminate structure formed over the central part of the nitride semiconductor layer 23. The laminate structure comprises a nitride active layer 24 formed on the nitride semiconductor layer, a second conductive nitride semiconductor layer 25 formed on the active layer 24, a transparent metal layer 26 formed on the second conductive nitride semiconductor layer 25 and a first electrode 27 formed on a part of the transparent metal layer 26.

Further, according to the first preferred embodiment of the present invention, the blue light emitting diode comprises a second electrode formed on the peripheral part R2 of the first conductive nitride semiconductor layer 23 which is not covered by the laminate structure. The second electrode is formed with a main portion 28 and extensions 28a, 28b extended from the main portion 28, in a band shape. The main portion 28 is formed near a corner where adjacent edges 23c, 23d intersect each other in the surface of the first nitride semiconductor layer 23. The extensions 28a, 28b are formed adjacent to edges 23c, 23d of the surface of the first conductive nitride semiconductor layer 23 so that they are extended along at least one edge (23c or 23d) of the surface of the first conductive nitride semiconductor layer 23.

Preferably, the first electrode 27 is formed diagonally to the main portion 28 of the second electrode and the extensions 28a, 28b of the second electrode is extended along each of the edges 23c, 23d to which the main portion 28 of the second electrode is adjacent. By the extensions 28a, 28b of the second electrode formed on the peripheral part R2 over the first conductive nitride semiconductor 23, that is, a region N1 extended in a lateral direction and a region N2 extended in a longitudinal direction, the concentration of the current density as in the region d of FIG. 3 is prevented, thereby avoiding a current crowding phenomenon due to the concentrated current density.

Figure 5A:
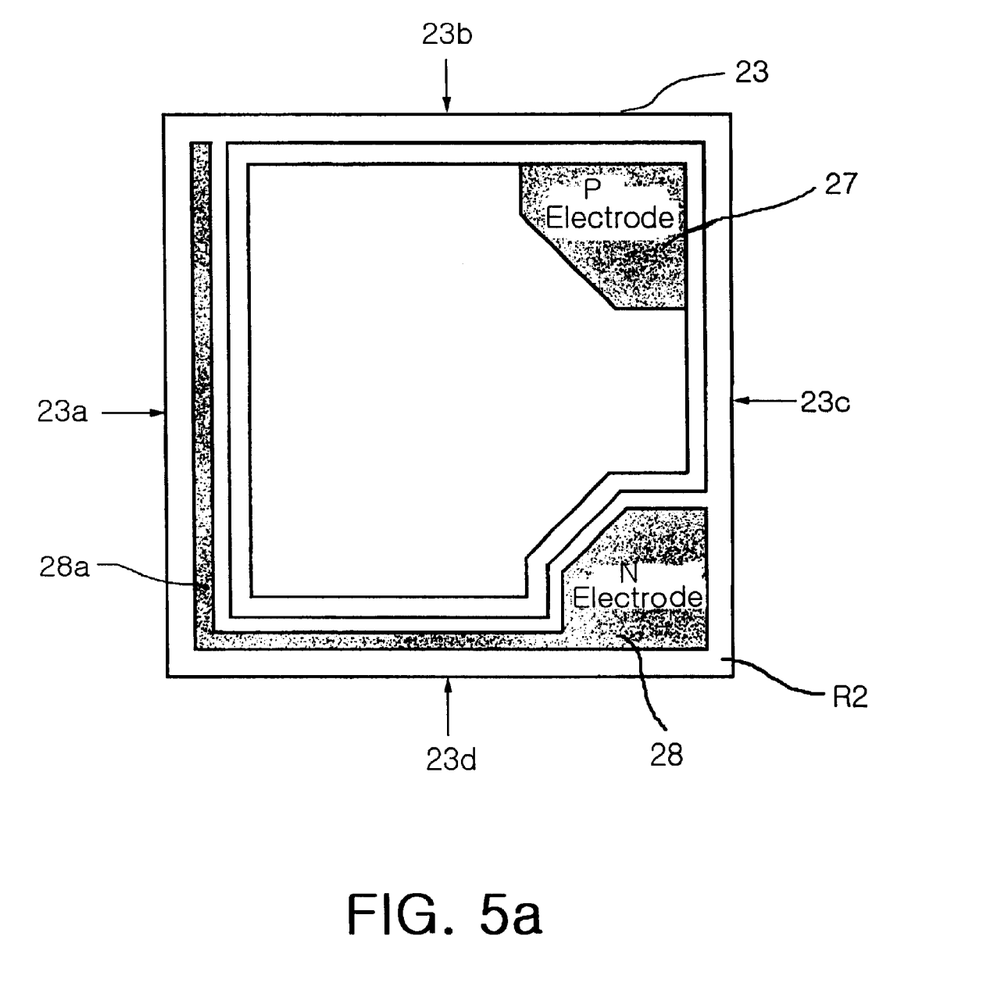
FIGS. 5a–5c are plan views showing modifications of the first embodiment according to the present invention.
Figure 5B:
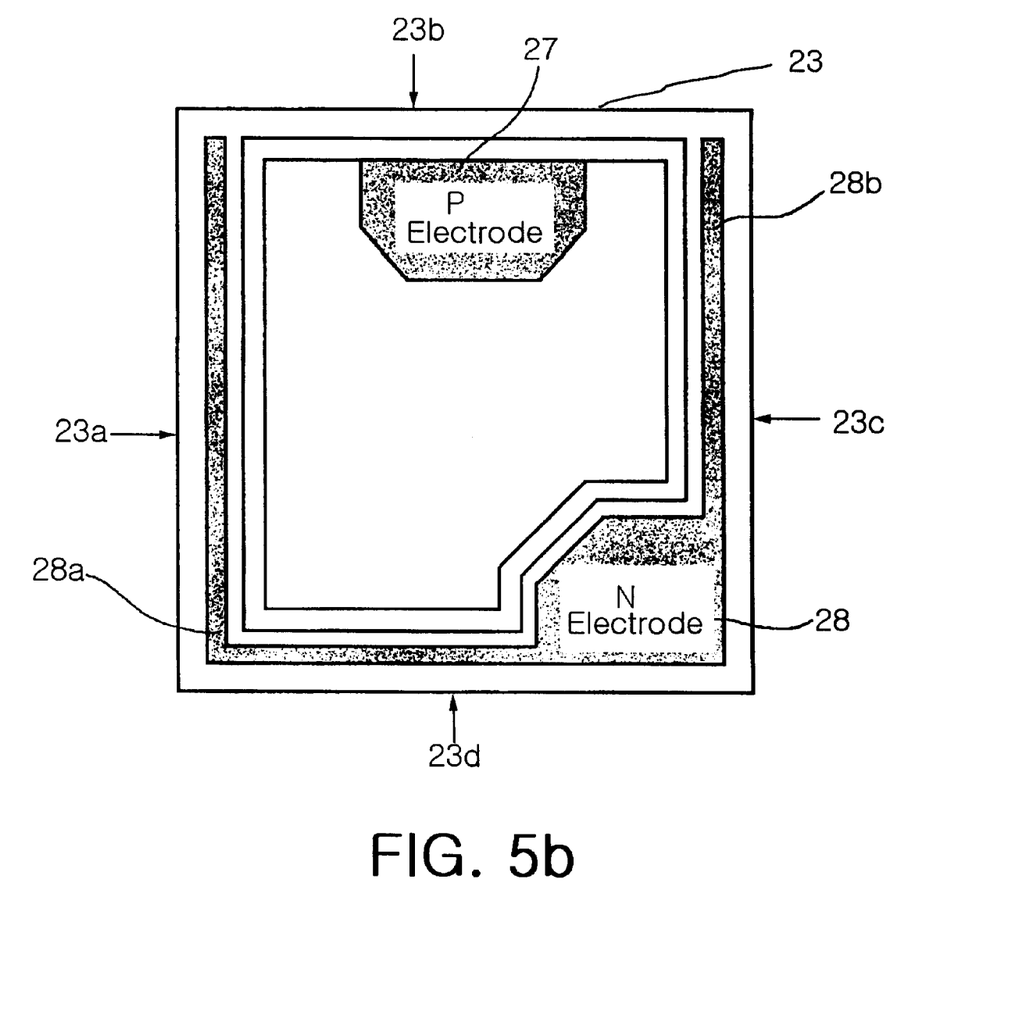
Figure 5C:
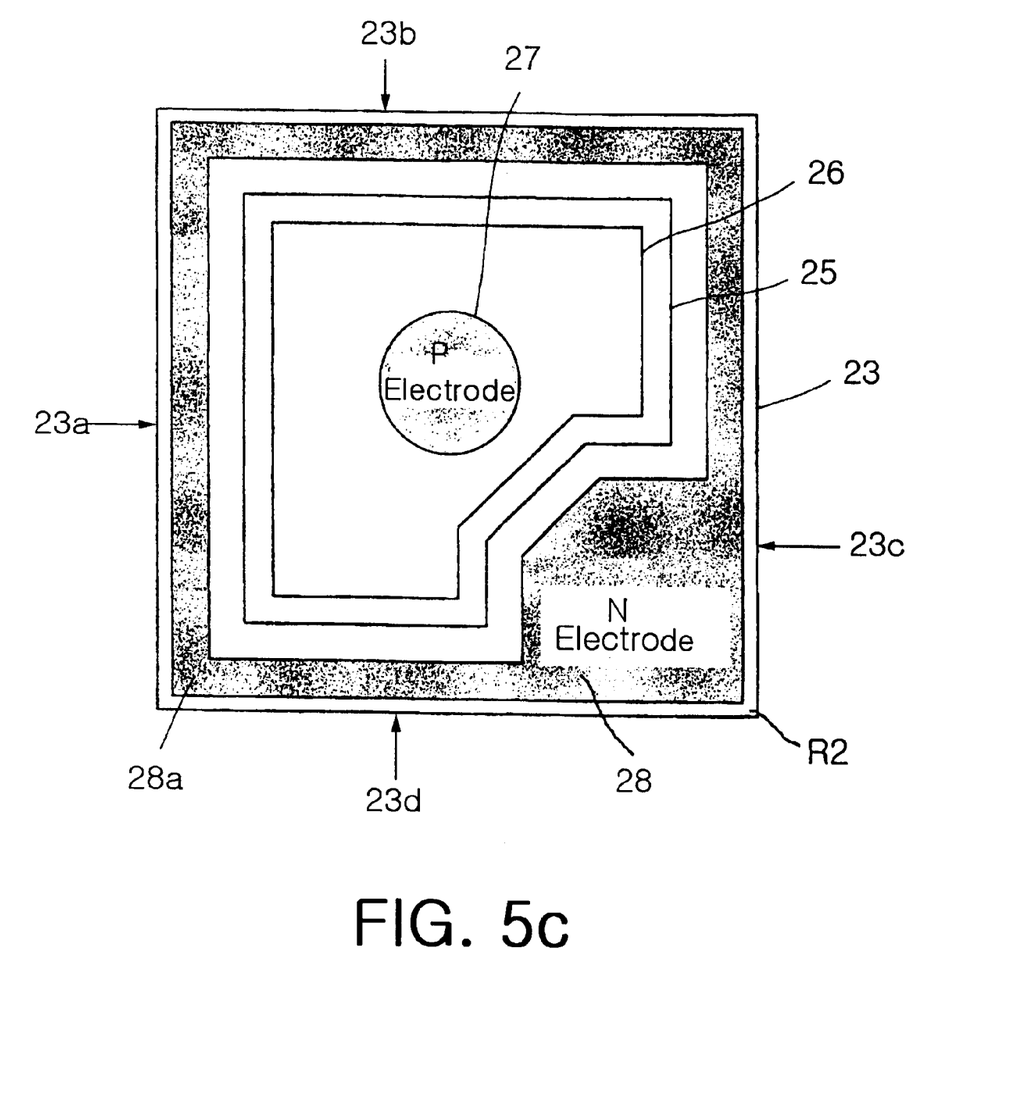

FIGS. 5a to 5c show plan views of a blue light emitting diode according to modifications of the first preferred embodiment of the present invention. Referring to FIG. 5a, the first electrode 27 is formed near a corner including any one of two edges of the transparent metal layer 26 to which the main portion 28 of a second electrode is adjacent. The extension 28a of the second electrode is extended along the two edges 23a, 23d intersecting each other at the corner in the first conductive nitride semiconductor layer 23, which is located on a diagonal line to the first electrode 27.

Referring to FIG. 5b, the first electrode 27 is formed on the middle of one of two edges of the transparent metal layer 26 which are not adjacent to the main portion 28 of the second electrode. As shown in FIG. 5b, when the first electrode 27 is formed on the middle of the edge 23b, the extension 28a of the second electrode is extended along the two edges 23a, 23d and the extension 28b is extended along the edge 23c. That is, the two extensions are extended from the main portion 28 of the second electrode along all the edges over the peripheral part 2 except for the edge on which the first electrode 27 is formed.

Next, referring to FIG. 5c, the first electrode 27 is formed in the center of the transparent metal layer 26. The extension 28a of the second electrode is extended over the peripheral part R2 of the first conductive nitride semiconductor layer 26 while surrounding the central part R1. That is, the extension 28a is formed on four edges 23a to d of the first conductive nitride semiconductor 26 and thus forms a closed square pattern surrounding the central part R1.

By the above described electrode structure, that is, the location of electrodes and their extensions according to the modification of the first preferred embodiment of the present invention, the concentration region of the current density can be dispersed in all directions. Further, the current crowding phenomenon due to the concentrated current density can be further decreased.

As described above, the location for the first electrode to be formed can be altered variously. The locations described above are applicable to the blue light emitting diode according to another embodiment of the present invention.

Meanwhile, the main portion 28 and its extension 28a of the second electrode keep a prescribed spacing from the central part R1. The spacing is preferably set to be any value within the range between 5 µm and 20 µm, which is applicable to the blue light emitting diode according to another embodiment of the present invention. The value is derived from the ones generally used in the blue light emitting diode, however, the present invention is not limited to it. The value may be varied depending on the standard for the products. Following the trend toward optimization and hence, miniaturization of products the value may be made smaller.

Therefore, according to the blue light emitting diode according to the first preferred embodiment of the present invention, through the extensions 28a of the second electrode formed over the peripheral part of the first conductive nitride semiconductor 23, that is, the region N1 extended in the lateral direction and the region N2 extended in the longitudinal direction in FIG. 4a, the concentration region D of the current density in FIG. 3 can be dispersed, thereby the current crowding phenomenon due to the concentrated current density can be decreased.

Next, a blue light emitting diode according to the second preferred embodiment of the present invention will be described.

Figure 6A:
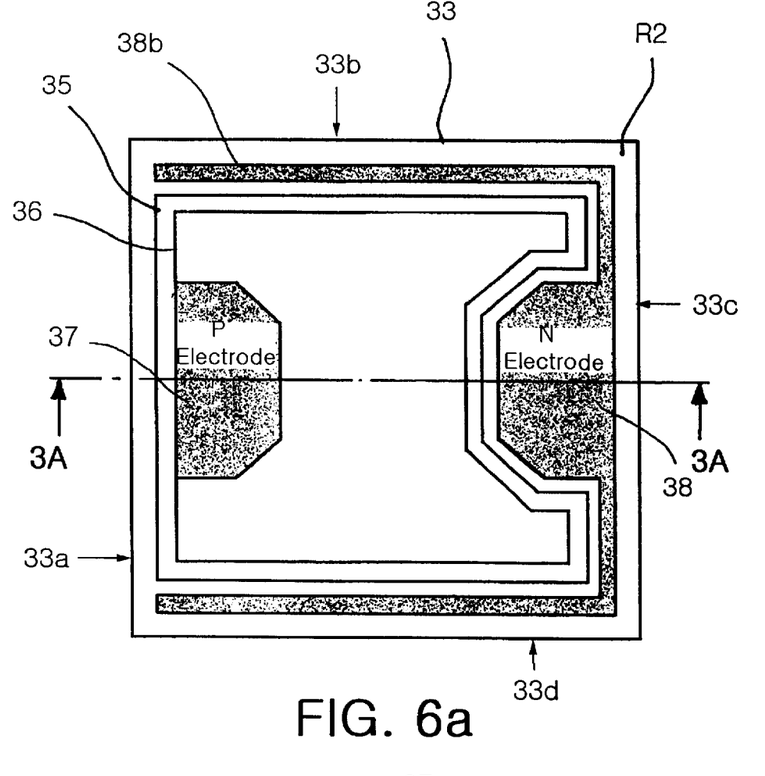
FIGS. 6a and 6b is a plan view of a blue light emitting diode according to the second embodiment of the present invention and a sectional view taken along line 3A—3A in FIG. 6a, respectively.
Figure 6B:
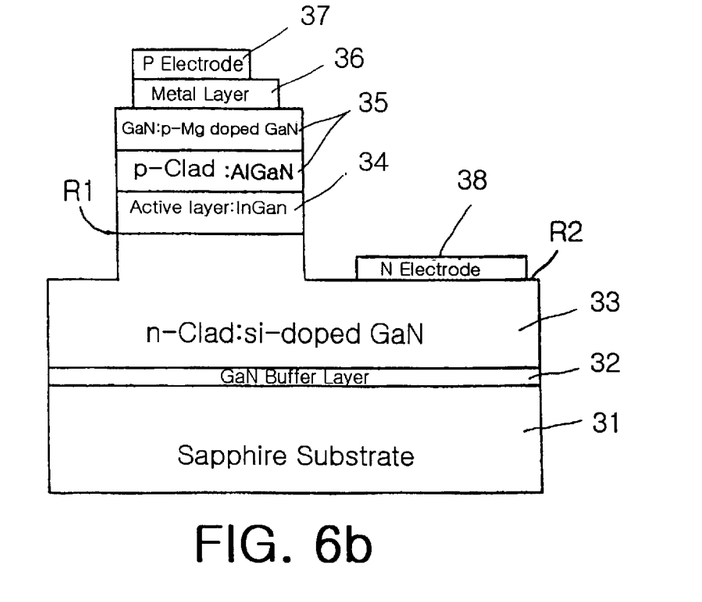

FIG. 6a shows a plan view of a blue light emitting diode according to the second embodiment of the present invention and FIG. 6b shows a sectional view taken along line 3A—3A in FIG. 6a. As shown in FIG. 6a, the blue light emitting diode of the second preferred embodiment according to the present invention includes an insulating substrate 31 typically in a square shape and a first conductive nitride semiconductor layer 33 formed on an entire surface of the insulating substrate 31. The nitride semiconductor layer 33 has a surface divided into a central part R1 and an exposed peripheral part R2. The peripheral part R2 is formed over the surfaces adjacent to edges 33a to 33d of the nitride semiconductor layer 33 and along the edges 33a to 33d of the nitride semiconductor layer 33 and the central part R1 is surrounded by the peripheral part R2. The blue light emitting diode further comprises a buffer layer 32 disposed between the insulating substrate 31 and the first conductive nitride semiconductor layer 33.

Also, the blue light emitting diode includes a laminate structure formed over the central part of the nitride semiconductor layer 33. The laminate structure comprises a nitride active layer 34 formed on the nitride semiconductor layer, a second conductive nitride semiconductor layer 35 formed on the active layer 34, a transparent metal layer 36 formed on the second conductive nitride semiconductor layer 35 and a first electrode 37 formed on a part of the transparent metal layer 36.

Further, according to the second preferred embodiment of the present invention, the blue light emitting diode comprises a second electrode formed on the peripheral part R2 of the first conductive nitride semiconductor layer 33 which is not covered by the laminate structure. The second electrode is formed with a main portion 38 and extensions 38a, 38b extended from the main portion 38, in a band shape. The main portion 38 is formed on the middle of an edge 33c over the surface of the first nitride semiconductor layer 33. The extensions 38a, 38b are formed adjacent to and along edges 33b, 33c, 33d over the surface of the first conductive nitride semiconductor layer 33 so that they are extended along at least one edge over the surface of the first conductive nitride semiconductor layer 33.

Preferably, the first electrode 37 is formed near the middle of an edge of the transparent metal layer 36, opposite to the main portion 38 of the second electrode and the extensions 38a, 38b of the second electrode are extended along the edges 33b, 33c, 33d of the first conductive nitride semiconductor 33 to which the first electrode is not adjacent. By the above described electrode structure, that is, the main portion and the extensions of electrodes according to the second preferred embodiment of the present invention, the concentration region of the current density can be dispersed in all directions. Further, the current crowding phenomenon due to the concentrated current density can be further decreased.

In order to verify a resistance to Electro-Static Discharging (ESD), the conventional blue light emitting diode shown in FIG. 3 and the blue light emitting diode according to the second preferred embodiment of the present invention shown in FIG. 6 are subjected to an ESD test under identical conditions. The conditions include charging a capacitor of 200 pF at an applied voltage of 200 V for each of the lamps having a diameter of 3 mm, and discharging at an interval of 1 second in the forward direction through a resistance of 0Ω. The results with a conventional blue light emitting diode and the blue light emitting diode of the present invention are given in Tables 1 and 2, below. In the tables, Vf (V) means a driving voltage in the forward direction, Po means a power of output light and Iv means brightness of light.

TABLE 1

Conventional Blue Light Emitting Diode of FIG. 3

| Test Round No. | Before the ESD test | | | After the ESD test | | |
| --- | --- | --- | --- | --- | --- | --- |
| | Vf (V) | Po (MW/sr) | Iv (cd) | Vf (V) | Po (MW/sr) | Iv (cd) |
| 1 | 3.50 | 2.3004 | 0.1485 | * | * | * |
| 2 | 3.32 | 2.9898 | 0.1873 | 3.36 | 3.0591 | 0.1923 |
| 3 | 3.37 | 3.5225 | 0.1968 | 3.35 | 3.1015 | 0.1760 |
| 4 | 3.46 | 3.3217 | 0.1999 | 3.38 | 1.8834 | 0.1222 |
| 5 | 3.34 | 3.5914 | 0.2248 | 3.32 | 3.6457 | 0.2302 |
| 6 | 3.37 | 3.3670 | 0.1959 | 3.36 | 3.1262 | 0.1870 |
| 7 | 3.50 | 3.0425 | 0.1715 | * | * | * |
| 8 | 3.41 | 3.2869 | 0.2039 | * | * | * |
| 9 | 3.36 | 3.1178 | 0.1797 | * | * | * |
| 10 | 3.46 | 1.9343 | 0.1135 | 3.45 | 2.1165 | 0.1230 |
| Average | 3.41 | 3.0474 | 0.1822 | 3.37 | 2.8221 | 0.1718 |
| Deviation | 0.07 | 0.5335 | 0.0316 | 0.04 | 0.6759 | 0.0422 |

* The diode is broken down

TABLE 2

Blue Light Emitting Diode of FIG. 6

| Test Round No. | Before the ESD test | | | After the ESD test | | |
| --- | --- | --- | --- | --- | --- | --- |
| | Vf (V) | Po (MW/sr) | Iv (cd) | Vf (V) | Po (MW/sr) | Iv (cd) |
| 1 | 3.24 | 1.9128 | 0.1590 | 3.22 | 1.8385 | 0.1544 |
| 2 | 3.25 | 3.5098 | 0.2838 | 3.22 | 2.9615 | 0.2446 |
| 3 | 3.24 | 2.2783 | 0.1931 | 3.43 | 1.9416 | 0.1654 |
| 4 | 3.28 | 3.1015 | 0.2488 | 3.22 | 2.8606 | 0.2338 |
| 5 | 3.23 | 2.1798 | 0.1799 | 3.06 | 0.7413 | 0.0721 |
| 6 | 3.23 | 2.4579 | 0.2040 | 3.22 | 2.4245 | 0.2060 |
| 7 | 3.25 | 2.4246 | 0.2004 | 3.25 | 2.2248 | 0.1866 |
| 8 | 3.23 | 2.3103 | 0.1954 | 3.22 | 2.0674 | 0.1750 |
| 9 | 3.30 | 2.8122 | 0.2215 | 3.28 | 2.3888 | 0.1903 |
| 10 | 3.23 | 2.6388 | 0.2187 | 3.21 | 2.0611 | 0.1740 |
| Average | 3.25 | 2.5626 | 0.2105 | 3.23 | 2.1510 | 0.1802 |
| Deviation | 0.02 | 0.4713 | 0.0354 | 0.09 | 0.6183 | 0.0477 |

From the results shown in Table 1, it is noted that 40% of the conventional blue light emitting diodes illustrated in FIG. 3 were broken down in the ESD test. As apparent from the data of Table 2, the blue light emitting diodes of the present invention were not broken down in the same test. Therefore, it is proved that the blue light emitting diode of the present invention has an increased resistance to ESD than the conventional blue light emitting diode.

Next, a blud light emitting diode according to the third preferred embodiment of the present invention will be described.

Figure 7:
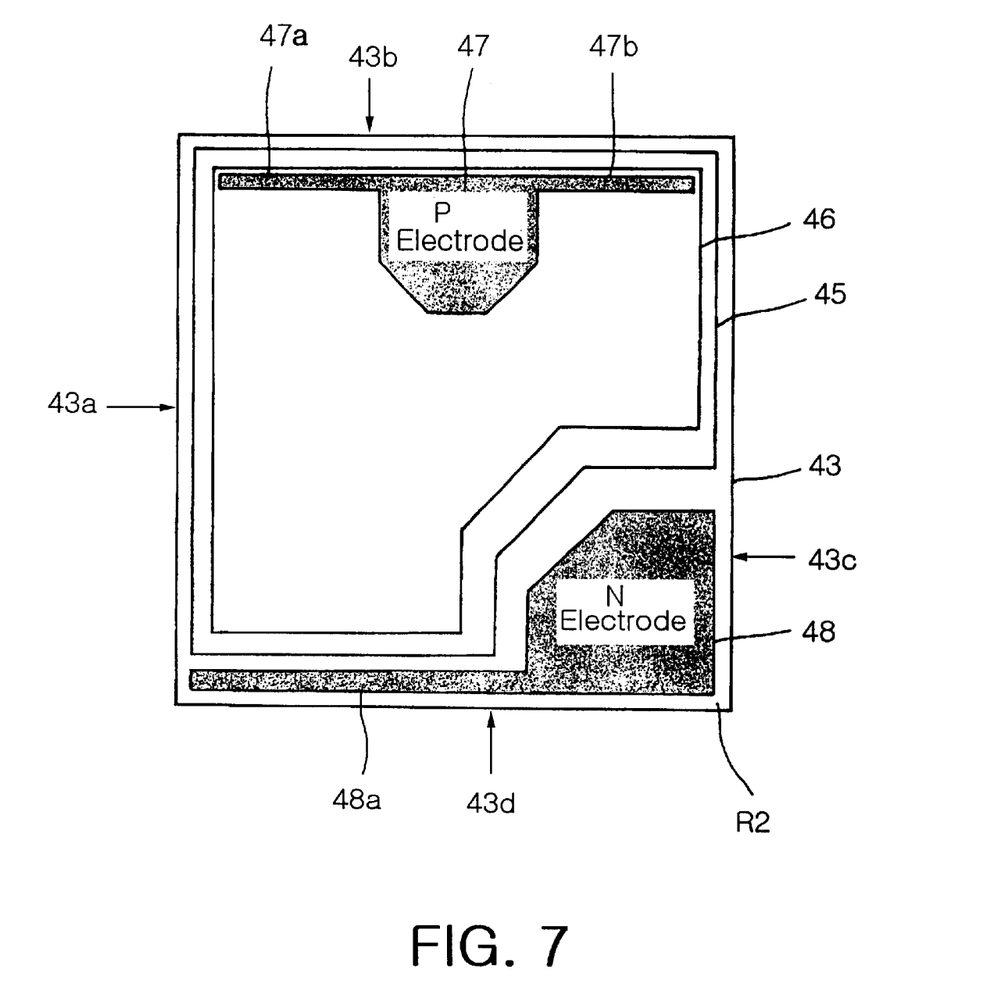
FIG. 7 is a plan view of a blue light emitting diode according to the third embodiment of the present invention.
Figure 8:
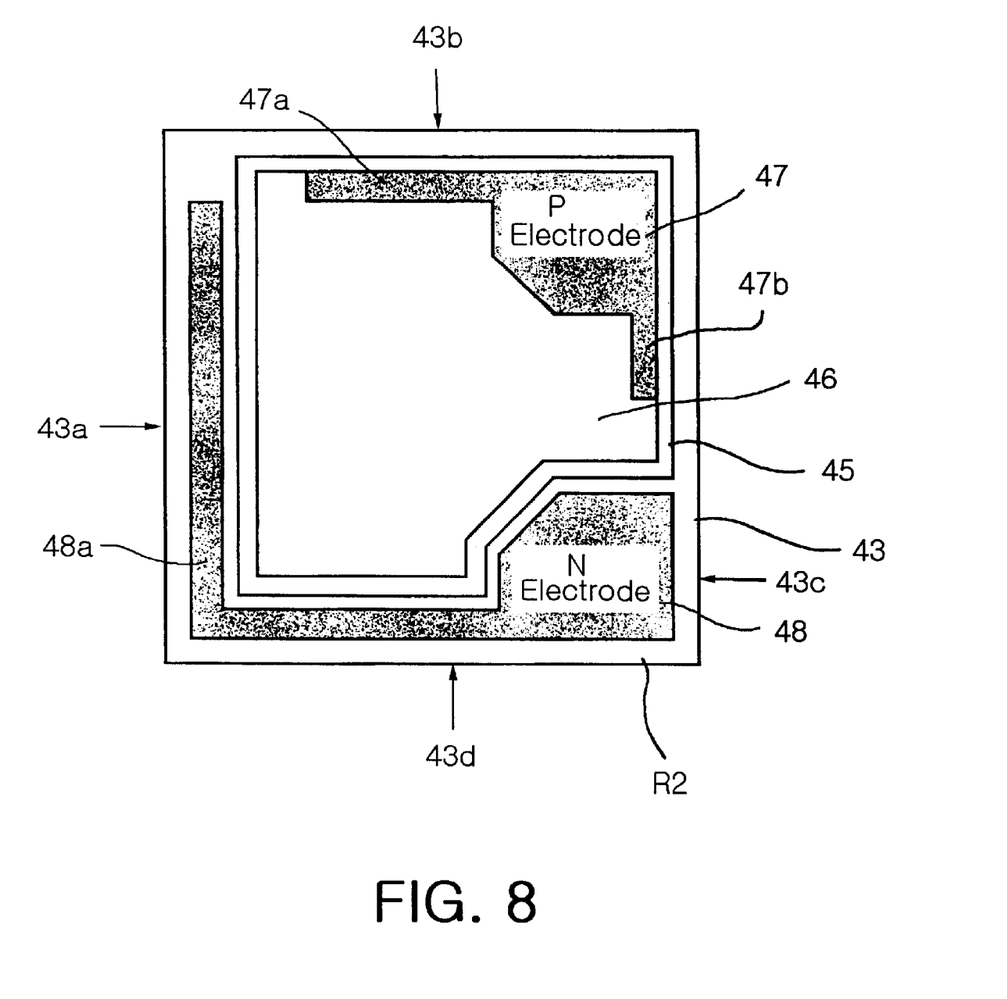
FIG. 8 is a plan view showing a modification to the third embodiment of the present invention.

FIG. 7 shows a plan view of a blue light emitting diode according to the third preferred embodiment of the present invention and FIG. 8 shows a plan view of a blue light emitting diode according to a modification of the third preferred embodiment of the present invention. The blue light emitting diodes shown in FIGS. 7 and 8 are the same in their organization and structure with the blue light emitting diode illustrated in the above first and second preferred embodiments of the present invention, except for the first electrode, the second electrode and extensions thereof. Therefore, descriptions with regard to the same organization and structure will be omitted.

The blue light emitting diode according to the third preferred embodiment of the present invention includes a first electrode formed over a part of a transparent metal layer 46 included in the laminate structure as described above and a second electrode formed over a peripheral part R2 of the first conductive nitride semiconductor layer which is not covered by the laminate structure. The first electrode is formed with a main portion 47 and extensions 47a, 47b extended from the main portion 47, in a band shape. The main portion 48 is formed near a corner where adjacent edges intersect each other on a surface of the metal layer 46. The extensions 47a, 47b are formed along at least one edge on the surface of the metal layer 46.

The second electrode is formed with a main portion 48 and extension 48a extended from the main portion 48, in a band shape. The main portion 48 of the second electrode is formed near a corner where adjacent edges 43c, 43d intersect each other in the surface of the first nitride semiconductor layer 43. The extensions 48a are formed adjacent an edge 43d of the surface of the first conductive nitride semiconductor layer 43 along at least one edge of the surface of the first conductive nitride semiconductor layer 43.

Preferably, as shown in FIG. 7, the main portion 47 of the first electrode is formed on the middle of any one of two edges of the transparent metal layer 46 which are not adjacent to the main portion 48 of the second electrode. The extensions 47a, 47b of the first electrode are extended along the one edge to which the main portion 47 of the first electrode is adjacent, from the main portion 47 in the both lateral direction. The extension 48 of the second electrode is formed on the edge 43d of the first conductive nitride semiconductor layer 43 opposite to the main portion 47 of the first electrode.

Referring to FIG. 8, the main portion 47 of the first electrode is formed near a corner including any one of two edges of the transparent metal layer 46 to which the main portion 48 of the second electrode is adjacent. The extension 47a, 47b of the first electrode is extended along the edges of the transparent metal layer 46 to which the main portion 47 of the first electrode is adjacent. The extension 48a of the second electrode is extended along the two edges 43a, 43d intersecting each other at the corner of the surface of the first conductive nitride semiconductor layer 23, which is located on a diagonal line to the main portion 47 of the first electrode 47.

By the above described main portion and the extensions of the electrodes according to the third preferred embodiment of the present invention and the modification thereof, the concentration region of the current density as shown in FIG. 3 can be dispersed evenly. Further, the current crowding phenomenon due to the concentrated current density can be further decreased.

As described above, the embodiments of the present invention are given for the purpose of illustration. For example, the spacing between the second electrode formed on the peripheral part and the central part over the N-type semiconductor layer having the active layer formed thereon means a certain distance capable of dispersing the concentrated current density through the extension of the electrode. Thus, one skilled in the art can make modifications in connection with the extension of the first electrode or the extension of the second electrode according to the present invention. However, the extension of the first electrode or the extension of the second electrode for the efficient dispersion of the current density will be involved in the spirit and scope of the present invention. This is because by such extensions of the electrode, the present invention disperses the concentrated current path to the extensions to prevent the rapid temperature increase. Accordingly, the present invention can be applied in various forms to planar type semiconductor devices requiring the efficient dispersion of the current density in the chip.

As described above, the blue light emitting diode according to the present invention disperses the current path locally concentrated through the extensions of the electrode, thereby reducing the temperature deviation in the chip and preventing the rapid temperature increase. Also, the blue light emitting diode according to the present invention is resistant to ESD in contrast to the general blue light emitting diode.

Further, the blue light emitting diode of the present invention is operated at a reduced driving voltage, circumventing the problem the conventional blue light emitting diode suffers from owing to a high driving voltage. Therefore, the present invention overcomes the problems associated with the rapid temperature increase due to the high current density resulting from the concentration of the current path and the low resistance to the ESD, thereby leading to improvement in the reliability of the blue light emitting diode and improvement of the quality.

Moreover, the structure of the electrode with the extensions according to the present invention can be applied to other planar type semiconductor devices in which the pyrogenetic phenomenon caused by the concentration of the current path is problematic.

In addition, the present invention can be applied to a modified manufacturing process, for example, in which after growing an epitaxial layer as a basic structure, the N-type semiconductor layer is etched.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed:

1. A blue light emitting diode, comprising:
   insulating substrate having a substantially square shape;
   a first nitride semiconductor layer of first conductive type formed on an entire surface of the insulating substrate, said first nitride semiconductor layer having a surface divided into a peripheral part and a central part, said peripheral part being arranged adjacent to and along edges of the first nitride semiconductor layer, and said central part being surrounded by the peripheral part;
   a laminate structure formed over the central part of the first nitride semiconductor layer, said laminate structure comprising a nitride active layer formed on the first nitride semiconductor layer, a second nitride semiconductor layer of second conductive type formed on the active layer, a transparent metal layer formed on the second nitride semiconductor layer, and a first electrode formed on a part of the transparent metal layer; said first electrode being formed with a first main portion and first extensions having a band shape and extending from the first main portion, said first main portion being formed along at least one edge of the metal layer, and said extensions being formed along at least said one edge of the metal layer; and
   a second electrode formed over the peripheral part of the first nitride semiconductor layer which is not covered by the laminate structure, said second electrode being formed with a second main portion and a second extension having a band shape and extending from the second main portion, said second main portion being formed near a corner of the first nitride semiconductor layer, said second extension being formed adjacent to and along at least one edge in the first nitride semiconductor layer;
   wherein the first main portion of the first electrode is formed at a corner including any one of two edges of the transparent metal layer to which the second main portion of the second electrode is adjacent and the first extensions of the first electrode extend along the two edges of the transparent metal layer to which the first main portion of the first electrode is adjacent.

2. The blue light emitting diode according to claim 1, wherein the second extension of the second electrode is extended along the two edges intersecting each other at the corner of the first nitride semiconductor layer, which is located diagonally opposite to the first main portion of the first electrode.

3. A blue light emitting diode, comprising:
   a substrate made of an insulating material;
   a first nitride semiconductor layer of first conductive type formed on the substrate, said first nitride semiconductor layer having an upper surface divided into a central part and a peripheral part, said central part being completely surrounded by the peripheral part;

a laminate structure formed on top and in the central part of the first nitride semiconductor layer, said laminate structure comprising a nitride active layer on the first nitride semiconductor layer, a second nitride semiconductor layer of second conductive type formed on the active layer, a transparent metal layer formed on the second nitride semiconductor layer, and a first electrode formed over a part of the metal layer; and a second electrode formed on top and in the peripheral part of the first nitride semiconductor layer which is not covered by the laminate structure, said second electrode having an enlarged main portion and at least one extension extending along at least one edge of the first nitride semiconductor layer, said extension extending from a side of the enlarged main portion and having a width smaller than a dimension of said side of the enlarged main portion, wherein the metal layer has an edge extending along said at least one edge of the first nitride semiconductor layer and said extension of the second electrode, a dimension of said edge of the metal layer as measured in a direction parallel to said at least one edge of the first nitride semiconductor layer is smaller than that of the second electrode, the first nitride semiconductor layer has a substantially rectangular shape, the first electrode and the enlarged main portion of the second electrodes are arranged in diagonally opposite corners of the first nitride semiconductor layer, and said extension includes two beams extending along two edges of the first nitride semiconductor layer that are associated with the corner in which the enlarged main portion is situated.

4. A blue light emitting diode, comprising:

a substrate made of an insulating material;

a first nitride semiconductor layer of first conductive type formed on the substrate, said first nitride semiconductor layer having an upper surface divided into a central part and a peripheral part, said central part being completely surrounded by the peripheral part;

a laminate structure formed on top and in the central part of the first nitride semiconductor layer, said laminate structure comprising a nitride active layer on the first nitride semiconductor layer, a second nitride semiconductor layer of second conductive type formed on the active layer, a transparent metal layer formed on the second nitride semiconductor layer, and a first electrode formed over a part of the metal layer; and a second electrode formed on top and in the peripheral part of the first nitride semiconductor layer which is not covered by the laminate structure, said second electrode having an enlarged main portion and at least one extension extending along at least one edge of the first nitride semiconductor layer, said extension extending from a side of the enlarged main portion and having a width smaller than a dimension of said side of the enlarged main portion, wherein the metal layer has an edge extending along said at least one edge of the first nitride semiconductor layer and said extension of the second electrode, a dimension of said edge of the metal layer as measured in a direction parallel to said at least one edge of the first nitride semiconductor layer is smaller than that of the second electrode, the first nitride semiconductor layer has a substantially rectangular shape, the first electrode and the enlarged main portion of the second electrodes are arranged in successive corners of the first nitride semiconductor layer, and said extension includes a beam continuously extending along two successive edges of the first nitride semiconductor layer that are not associated with the corner in which the first electrode is situated.

5. A blue light emitting diode, comprising:

a substrate made of an insulating material;

a first nitride semiconductor layer of first conductive type formed on the substrate, said first nitride semiconductor layer having an upper surface divided into a central part and a peripheral part, said central part being completely surrounded by the peripheral part;

a laminate structure formed on top and in the central part of the first nitride semiconductor layer, said laminate structure comprising a nitride active layer on the first nitride semiconductor layer, a second nitride semiconductor layer of second conductive type formed on the active layer, a transparent metal layer formed on the second nitride semiconductor layer, and a first electrode formed over a part of the metal layer; and a second electrode formed on top and in the peripheral part of the first nitride semiconductor layer which is not covered by the laminate structure, said second electrode having an enlarged main portion and at least one extension extending along at least one edge of the first nitride semiconductor layer, said extension extending from a side of the enlarged main portion and having a width smaller than a dimension of said side of the enlarged main portion, wherein the metal layer has an edge extending along said at least one edge of the first nitride semiconductor layer and said extension of the second electrode, a dimension of said edge of the metal layer as measured in a direction parallel to said at least one edge of the first nitride semiconductor layer is smaller than that of the second electrode, the first nitride semiconductor layer has a substantially rectangular shape, the first electrode is arranged in a middle region of one edge of the first nitride semiconductor layer, and the second electrode extends along the other three edges of the first nitride semiconductor layer.

6. The blue light emitting diode according to claim 5, wherein the second electrode extends along entire lengths of at least two edges of the metal layer.

7. The blue light emitting diode according to claim 5, wherein the enlarged main portion of the second electrode is situated in one of the two corners of the first semiconductor layer that are formed by the other three edges, and said extension includes two beams.

8. The blue light emitting diode according to claim 5, wherein the enlarged main portion of the second electrodes is arranged in middle regions of the edge of the first semiconductor layer that is opposite to the edge associated with the first electrode.

9. The blue light emitting diode according to claim 8, wherein said extension includes two beams each extending along an entire length of an edge of the metal layer.

10. A blue light emitting diode, comprising:

a substrate made of an insulating material;

a first nitride semiconductor layer of first conductive type formed on the substrate, said first nitride semiconductor layer having an upper surface divided into a central part and a peripheral part, said central part being completely surrounded by the peripheral part;

a laminate structure formed on top and in the central part of the first nitride semiconductor layer, said laminate structure comprising a nitride active layer on the first nitride semiconductor layer, a second nitride semiconductor layer of second conductive type formed on the active layer, a transparent metal layer formed on the second nitride semiconductor layer, and a first electrode formed over a part of the metal layer; and a second electrode formed on top and in the peripheral part of the first nitride semiconductor layer which is not covered by the laminate structure, said second electrode having an enlarged main portion and at least one extension extending along at least one edge of the first nitride semiconductor layer, said extension extending from a side of the enlarged main portion and having a width smaller than a dimension of said side of the enlarged main portion, wherein said first electrode has an enlarged main portion and at least one extension extending along at least one edge of the metal layer, said extension of the first electrode extending from a side of the enlarged main portion of the first electrode and having a width smaller than a dimension of said side of the enlarged main portion of the first electrode, the first nitride semiconductor layer has a substantially rectangular shape, said first and second electrodes extending along opposite edges of the first nitride semiconductor layer, the extension of the first electrode includes two substantially parallel beams extending in opposite directions, and the enlarged main portion of the second electrode is situated in a corner of the first nitride semiconductor layer that is associated with the respective one of said opposite edges.

11. The blue light emitting diode according to claim 10, wherein a dimension of the second electrode as measured in a direction of said opposite edges is larger than that of the first electrode.

12. A blue light emitting diode, comprising:

a substrate made of an insulating material;

a first nitride semiconductor layer of first conductive type formed on the substrate said first nitride semiconductor layer having an upper surface divided into a central part and a peripheral part, said central part being completely surrounded by the peripheral part;

a laminate structure formed on top and in the central part of the first nitride semiconductor layer, said laminate structure comprising a nitride active layer on the first nitride semiconductor layer, a second nitride semiconductor layer of second conductive type formed on the active layer, a transparent metal layer formed on the second nitride semiconductor layer, and a first electrode formed over a part of the metal layer; and a second electrode formed on top and in the peripheral part of the first nitride semiconductor layer which is not covered by the laminate structure, said second electrode having an enlarged main portion and at least one extension extending along at least one edge of the first nitride semiconductor layer, said extension extending from a side of the enlarged main portion and having a width smaller than a dimension of said side of the enlarged main portion, wherein said first electrode has an enlarged main portion and at least one extension extending along at least one edge of the metal layer, said extension of the first electrode extending from a side of the enlarged main portion of the first electrode and having a width smaller than a dimension of said side of the enlarged main portion of the first electrode, the first nitride semiconductor layer has a substantially rectangular shape, the enlarged main portions of said first and second electrodes are located in successive corners of the first nitride semiconductor layer, the extension of the second electrode includes a beam continuously extending along two successive edges of the first nitride semiconductor layer that are not associated with the corner in which the enlarged main portion of the first electrode is situated, the extension of the first electrode includes two beams extending along two edges of the first nitride semiconductor layer that are associated with the corner in which the enlarged main portion of the first electrode is situated.

* * * * *